United States Patent [19]

Tkaczyk et al.

[11] Patent Number: 5,646,097
[45] Date of Patent: Jul. 8, 1997

[54] METHOD OF FABRICATING A (1223) TL-BA-CA-CU-O SUPERCONDUCTOR

[75] Inventors: John Eric Tkaczyk, Delanson; Kenneth Wilbur Lay, Schenectady, both of N.Y.; Qing He, Knoxville, Tenn.

[73] Assignee: General Electric Company, Schenectady, N.Y.

[21] Appl. No.: 573,602

[22] Filed: Dec. 15, 1995

Related U.S. Application Data

[63] Continuation of Ser. No. 364,872, Dec. 27, 1994, abandoned.

[51] Int. Cl.$^6$ .................................................. B05D 5/12
[52] U.S. Cl. ................ 505/470; 505/471; 505/434; 505/491; 505/501; 505/785; 427/62
[58] Field of Search ...................... 505/470, 471, 505/491, 434, 501, 120, 741, 783, 785; 427/62, 63

[56] References Cited

U.S. PATENT DOCUMENTS

| | | | |
|---|---|---|---|
| 4,997,811 | 3/1991 | Hermann et al. | 505/1 |
| 5,149,687 | 9/1992 | Galasso | 505/1 |

FOREIGN PATENT DOCUMENTS

| | | |
|---|---|---|
| 0447260A2 | 9/1991 | European Pat. Off. . |
| 1-305846 | 12/1989 | Japan . |
| 2-139808 | 5/1990 | Japan . |
| 3-137050 | 6/1991 | Japan . |

OTHER PUBLICATIONS

Qi et al, Physica C 176 (1991) pp. 38–42.
Politis et al, Modern Physics letters B. vol. 2, No. 9 (1988) pp. 1119–1123.
Lin et al, Jpn. J. Appl. Phys. 28(1) Jan. 1989, pp. L85–L87.
ZZ Sheng & AM Hermann, "Bulk Superconductivity at 120 K in the Tl–Ca/Ba–Cu–O System", Letters to Nature, vol. 332, Mar. 10, 1988, pp. 138–139.
PA Parilla, et al., "Thin and Thick Film Synthesis and Processing in the Tl–Ba–Ca–Cu–O System", Proceedings of the Sixth US–Japan Workshop on High Tc Superconductors, pp. 265–270, 1994.

*Primary Examiner*—Roy V. King
*Attorney, Agent, or Firm*—Noreen C. Johnson; William H. Pittman

[57] ABSTRACT

A method is disclosed for fabricating a polycrystalline <223> thallium-containing superconductor having high critical current at elevated temperatures and in the presence of a magnetic field. A powder precursor containing compounds other than thallium is compressed on a substrate. Thallium is incorporated in the densified powder precursor at a high temperature in the presence of a partial pressure of a thallium-containing vapor.

14 Claims, 2 Drawing Sheets

METHOD OF FABRICATING A (1223) TL-BA-CA-CU-O SUPERCONDUCTOR

This invention was made with the government support under Contract No. 87X-SE934V under DE-AC05-840R21400 awarded by the Department of Energy. The government has certain rights in this invention.

This application is a continuation of application Ser. No. 08/364,872 filed Dec. 27, 1994, now abandoned.

FIELD OF THE INVENTION

This invention relates to a method of preparing a superconducting conductor having high critical currents at elevated temperatures and in the presence of magnetic fields. In particular, this invention relates to the preparation of thallium-containing superconductors having uniform microstructure and superconducting phases over long lengths.

BACKGROUND OF THE INVENTION

Methods of preparing thallium system superconductors are documented in the literature. One method of preparation is reported in "Bulk Superconductivity at 120K in the Tl—Ca—Ba—Cu—O System," Z. Z. Sheng and A. M. Hermann, Nature Vol. 332, Mar. 10, 1988, pp. 138–139. Briefly described, appropriate amounts of powdered $Tl_2O_3$, CaO, and $BaCu_3O_4$ were mixed, ground, and pressed into pellets. The pellets were heated in a furnace at 880°–910° C. with an oxygen flowing atmosphere for three to five minutes. After heating, the pellets were quenched to room temperature in air or furnace cooled to room temperature. Basically, the pellets were reaction sintered by the heat treatment, forming a superconducting conductor.

Thin films of thallium superconductors have also been made by sequential thermal evaporation, sequential electron beam evaporation, and spray pyrolysis of nitrate solutions containing the precursor cations, such as calcium, copper, and barium. A limitation for these methods is the time needed to deposit a layer about 10–100 µm of the precursor deposit on the substrate.

The above-mentioned sintered ceramic pellets, thin films, and spray pyrolysis nitrate solutions are subsequently treated by heating in flowing air or oxygen at temperatures of about 800°–900° C. to form the superconducting compositions. Thus, another drawback for these systems is that thallium oxide has an appreciable vapor pressure at the temperature required to form the superconductor. As a result, thallium can be vaporized during the 800°–900° C. annealing temperatures leading to the loss of thallium from the superconductor.

Still a further drawback with the above methods of making thallium superconductors is that low current carrying capacity occurs when the grains are weakly linked or poorly connected. To achieve high current carrying capacity in these superconductors, the microstructure of the superconductor needs to have strongly interconnected or linked grains. However, this type of microstructure is not formed uniformly and consistently using present methods of fabrication.

Thus, there is a need for a method to fabricate thallium-containing superconductors where the method produces a uniform superconducting phase and microstructure over long lengths of superconductor material. There is also a need for a method that can process the thallium superconductor at high temperatures in the presence of an appropriate partial pressure of a reactive thallium vapor. There is an additional need to have a method of fabricating superconducting conductors rapidly and economically.

BRIEF DESCRIPTION OF THE INVENTION

A method of fabricating a polycrystalline thallium-containing superconductor is disclosed which comprises depositing on a substrate a powder precursor consisting essentially of compounds, except thallium compounds, that form the thallium-containing superconductor in a stoichiometric amount; increasing the density of the powder precursor on the substrate by compressing said powder precursor; and then soaking the compressed powder precursor with thallium at an appropriate temperature in the presence of a partial pressure of a thallium-containing vapor for a period of time to form a thallium-containing superconductor.

This fabrication method provides superconducting conductors with high critical currents due to a combination of high critical current density and large thickness. Starting with precursor powder rather than a sprayed pyrolysis nitrate solution allows rapid deposition of thick layers of the precursor material in a controlled and uniform manner.

The precursor material is in the powder form and does not contain thallium. Such material contains compounds in a stoichiometric amount to make a superconductor when combined with thallium. For instance, the precursor can be comprised of compounds containing barium, calcium, and copper in the correct stoichiometric amounts to form superconductors with thallium. An example of a precursor powder is $Ba_2Ca_2Cu_3O_7$ powder, that forms the $TlBa_2Ca_2Cu_3O_9$ superconductor, also known as the (1223) thallium superconductor. Other compounds that form thallium-containing superconductors include, but are not limited to, strontium, calcium, and copper compounds, which subsequently form thallium-strontium-calcium-copper superconductors; lead, strontium, barium, calcium, and copper compounds, which form thallium-lead-strontium-barium-calcium-copper superconductors; and other compounds that include bismuth in the thallium-containing superconductor.

DESCRIPTION OF THE INVENTION

Figure 1:
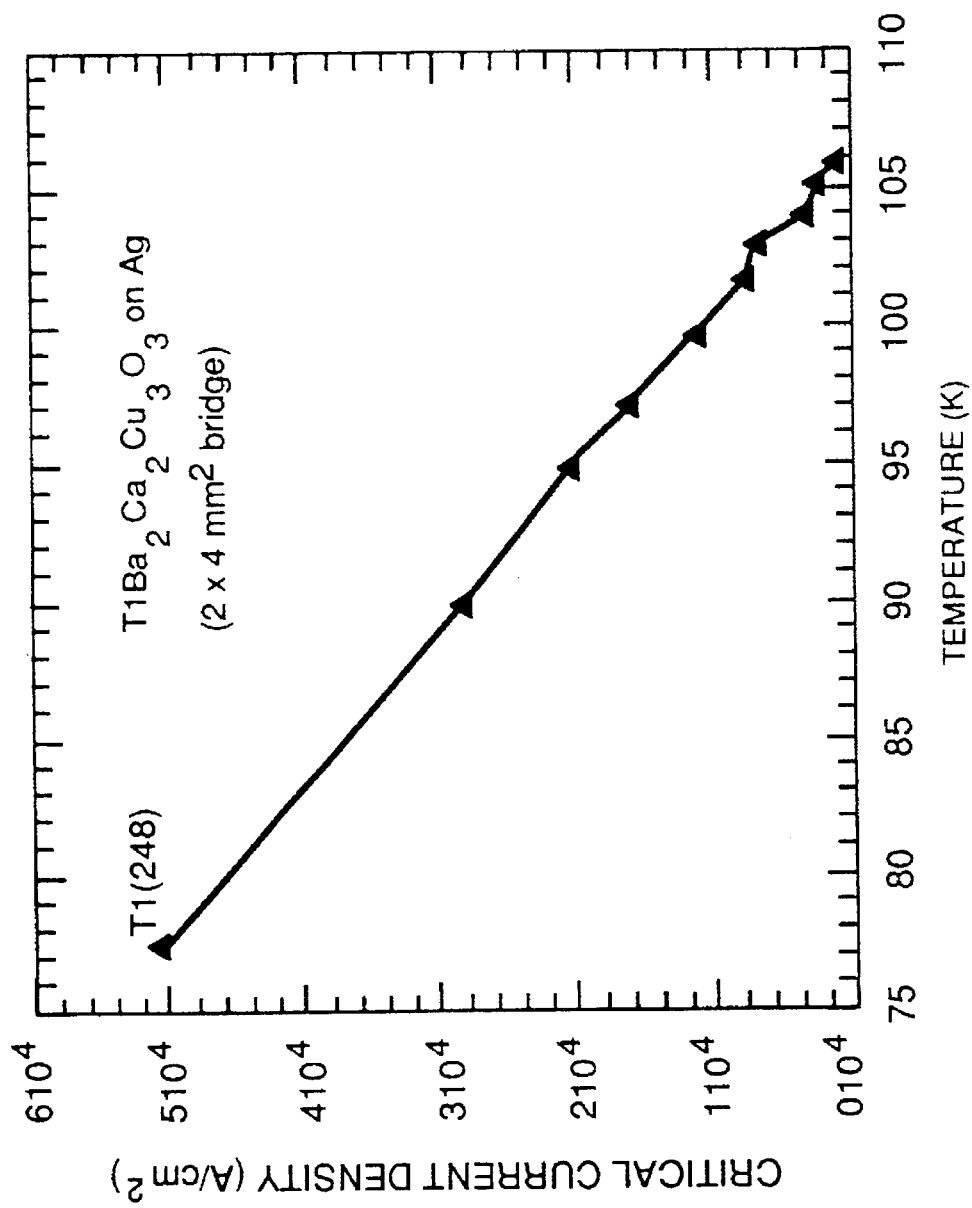
FIG. 1 is a graph of the critical current density versus temperature for $TlBa_2Ca_2Cu_3O_9$ fabricated by the method of this invention.

The method of this invention for making thallium superconducting conductors includes the steps of depositing a powder precursor, that is thallium-free, on a substrate, followed by pressing, rolling, or other means to increase the density of the precursor deposit through compression, and then processing the densified precursor at high temperatures in an oxygenated environment with an appropriate partial pressure of a thallium vapor species thereby forming a thallium-containing superconductor.

The following definitions are applicable to the present invention. The term "thallium-containing superconductor", as used herein, refers to a species that is capable of superconductivity and contains thallium. Said species can include, but is not limited to, wires, rods, pellets, tapes, and flat sheets, where wires and rods are cylindrical objects with a diameter, having a round cross-section and tapes and flat sheets are flat objects with width, length, and thickness dimensions, having a flat cross-section. Pellets can be cylindrical or flat. Examples of thallium-containing compounds are thallium-barium-calcium-copper oxides with formulas such as $TlBa_2Ca_2Cu_3O_9$ (known as <1223> phase), $Tl_2Ba_2CaCu_2O$ (known as <2212> phase), and $Tl_2Ba_2Ca_2Cu_3O$ (known as <2223> phase), and thallium-strontium-calcium-copper oxides with formulas such as $TlSr_2Ca_2Cu_3O_9$ (known as <1223> phase), $Tl_2Sr_2CaCu_2O$ (known as <2212> phase), and $Tl_2Sr_2Ca_2Cu_3O$ (known as <2223> phase). This invention applies to thallium-containing superconductors and is not limited to the above mentioned examples.

The term "substrate", as used herein, refers to flexible and rigid substrates, where a powder precursor is deposited on the surface. In cases where tapes, flat sheets, or pellets are used, the powder precursor may be deposited on one side or both sides, depending on the engineering requirements. On wires, rods, or pellets, the powder precursor is deposited on the complete outer cylindrical surface. Flexible substrates are preferred. Examples of the composition of the substrate include oxygen resistant metals, such as silver, gold, platinum, palladium, high temperature alloys known in the art, and iron-chromium alloys, along with ceramic compositions, such as lanthanum aluminate, strontium titanate, magnesium oxide, and yttria stabilized zirconia, which are often used to make ceramic tape. The surface finish of the substrate should be smooth to promote the granular alignment in the reacted deposit.

The term "powder precursor", as used herein, refers to an admixture of powder containing the stoichiometric amount of cations that are part of the final superconducting conductor, with the exception of thallium. Thallium is incorporated into the powder precursor at a later date by vapor phase thallination. Examples of such cations are the group barium, calcium and copper, which upon completion of the process of this invention, form the thallium-barium-calcium-copper oxide superconductor, or strontium, calcium, and copper cations which later form the thallium-strontium-calcium-copper oxide superconductor.

The stoichiometric amount of cations in the powder precursor is related to the desired superconductor to be fabricated. For instance, to form $TlBa_2Ca_2Cu_3O_9$, a powder precursor, such as $Ba_2Ca_2Cu_3O_7$, would be used. The powder precursor admixture can include individual compounds, such as calcium oxide, barium oxide, and copper oxide, so long as the correct stoichiometric amounts of cations that form the desired thallium-containing superconductor are present.

It is pointed out that silver may be a part of the desired powder precursor composition. It has been found that improved thallium-containing superconductors can be formed by providing from about 1 to 20 mole percent silver metal in the powder precursor during the thallium reaction and formation of the thallium superconductor. The amount of silver required is calculated as a mole percent based on the total moles of cation present in the powder precursor, excluding thallium. The role of silver in the precursor is the subject of commonly assigned application, U.S. Ser. No.08/291,214, filed Aug. 16, 1994, and titled "THALLIUM-CALCIUM-BARIUM-COPPER-OXIDE SUPERCONDUCTOR WITH SILVER AND METHOD", now U.S. Pat. No. 5,489,573. The preferred amount of silver is about 2 to 12 mole percent of the total cations present in the powder precursor. The silver is incorporated in the powder precursor as a silver-containing species, such as elemental silver, silver nitrate, or silver oxide. Silver may also be derived from a silver-containing substrate or a silver-coated substrate.

The individual compounds containing the cations do not necessarily have to be oxides. They can be nitrates, carbonates, and other decomposable compounds that provide the correct stoichiometric amount of the desired cation. A "decomposable compound" is one that decomposes, such as by evaporation or by a furnace bake, where after the decomposition process, only the cations and oxides needed for the superconductor remain as part of the powder precursor.

The powder precursor must have the correct stoichiometry, phase content, and particle size throughout the decomposition compressing steps. Small particle sizes tend to react quickly with thallium, where large particle sizes have a slower reaction rate.

The term "compressing" the precursor, as used herein, refers to pressing, rolling, squeezing, or other means to densify the powder precursor deposit before thallium is incorporated into the deposit. The pressure applied to the powder precursor should be at least about 1000 Kg/cm$^2$ (kilograms per centimeter squared) or above. Pressures about 5000 Kg/cm$^2$ or higher are preferred.

The term "compressed powder precursor" signifies the densified powder precursor after the compression operation.

The term "soaking" or "soak", as used herein, refers to the addition of the stoichiometric amount of thallium to the densified powder precursor deposit. This is accomplished by exposing the powder precursor deposit at a temperature between about 840°–930° C., for a given time dependent on its thickness, to a thallium-containing vapor. A precursor deposit of about 10 μm thick requires about one hour of exposure to a thallium vapor to achieve a thallium-containing superconductor.

By "thallium-containing vapor" is meant that a gaseous phase of thallium and oxygen, about one atmosphere oxygen, is passed over the precursor deposit. Varying partial pressures of thallium are employed depending on the temperature of the source of thallium. For instance, when the thallium source is heated to 700° C., the partial pressure of thallium is about $2\times10^{-4}$ atmospheres, and when the thallium source material is heated to 780° C., the corresponding partial pressure is about $10^{-2}$ atmospheres. It should be noted that a lower temperature is utilized to vaporize the thallium source (700°–780° C.) than for the soaking of the precursor deposit with thallium (840°–930° C.).

The following description further describes the invention. Deposition of the powder precursor onto a substrate can be accomplished using techniques known in the art, such as spray pyrolysis, dip coating, or tape casting of a slip. The slip contains the precursor powder mixed with a solvent and other ingredients used to maintain the powder in suspension and control the viscosity. The viscosity, based on common engineering principles, controls the thickness of the precursor deposit. The solvent and additional ingredients in the precursor mixture, such as carbonates, nitrates, binders, and the like, need to be driven from the precursor deposit prior to the compression stage. This can be accomplished by evaporation or by decomposition in a furnace bake-out.

Once the precursor coating is deposited on the substrate and decomposed, it must be pressed, rolled, or otherwise compressed to increase the density of the structure. Thickness uniformity of the original powder deposit is necessary to insure that the pressing acts uniformly over the area of the precursor deposit. Die or roller faces used for pressing or rolling should be polished to maintain a smooth surface and promote granular alignment. Pressures of at least 1000 Kg/cm$^2$ or greater can be applied to compress the deposit. 5000 Kg/cm$^2$ or greater is preferred.

After the powder precursor deposit is compressed, it is reacted at a temperature between about 840°–930° C., in an atmosphere containing the reactive thallium vapor species sufficient to form the superconducting phase with the correct microstructure. The preferred precursor temperature is about 860° C. For a two zone heating furnace, the thermal processing step is disclosed in the above-cited pending application, U.S. Ser. No. 08/291,214. The thallium source for the thallium vapor is a solid material, such as $Tl_2O_3$, and is heated at a separate, lower temperature than the precursor deposit. The thallium source is heated between about 700°–780° C. A source temperature of about 740° C. is preferred. Upon reaction with thallium, the precursor deposit forms C-axis alignment.

The following examples further describe the invention.

EXAMPLE 1

High critical current properties at 77K, zero field (~8 A/mm) have been demonstrated in segments of tape consisting of a superconducting coating about 10 µm thick on a silver substrate. The samples were fabricated as described by the method of this invention, using a spin cast technique to apply the powder precursor to the silver substrate. The silver substrate was first pressed in a polished die to smooth the surface, cleaned in acetone and methanol, and then weighed. The substrate was placed on a spinner and a few drops of the slip are deposited onto the surface. Then the substrate was immediately spun at 3 kRPM. The slip consists of a powder precursor containing 50 grams $Ba_2Ca_2Cu_3O_7$ powder and 2.5 grams $Ag_2O$ (silver oxide) powder with 0.37 grams Butvar B-76, 7 grams 4-methyl-2-pentanone, and 7 grams xylene.

The coated substrate with the powder precursor was then heated in flowing air to burn out the organic material at 5° C./min to 600° C. and soaked for 6 hours followed by cooling to room temperature at 5° C./min. The coated substrate is then heated in flowing oxygen at 5° C./min to 850° C. Upon reaching 850° C., the furnace is turned off after one minute and the precursor deposit is cooled at 5° C./min.

Next, the high spots of the deposit along the edges were removed by scraping and the precursor deposit was pressed using a pressure of 5000 kg/cm² over an area of about 0.8×1.2 cm².

Figure 2:
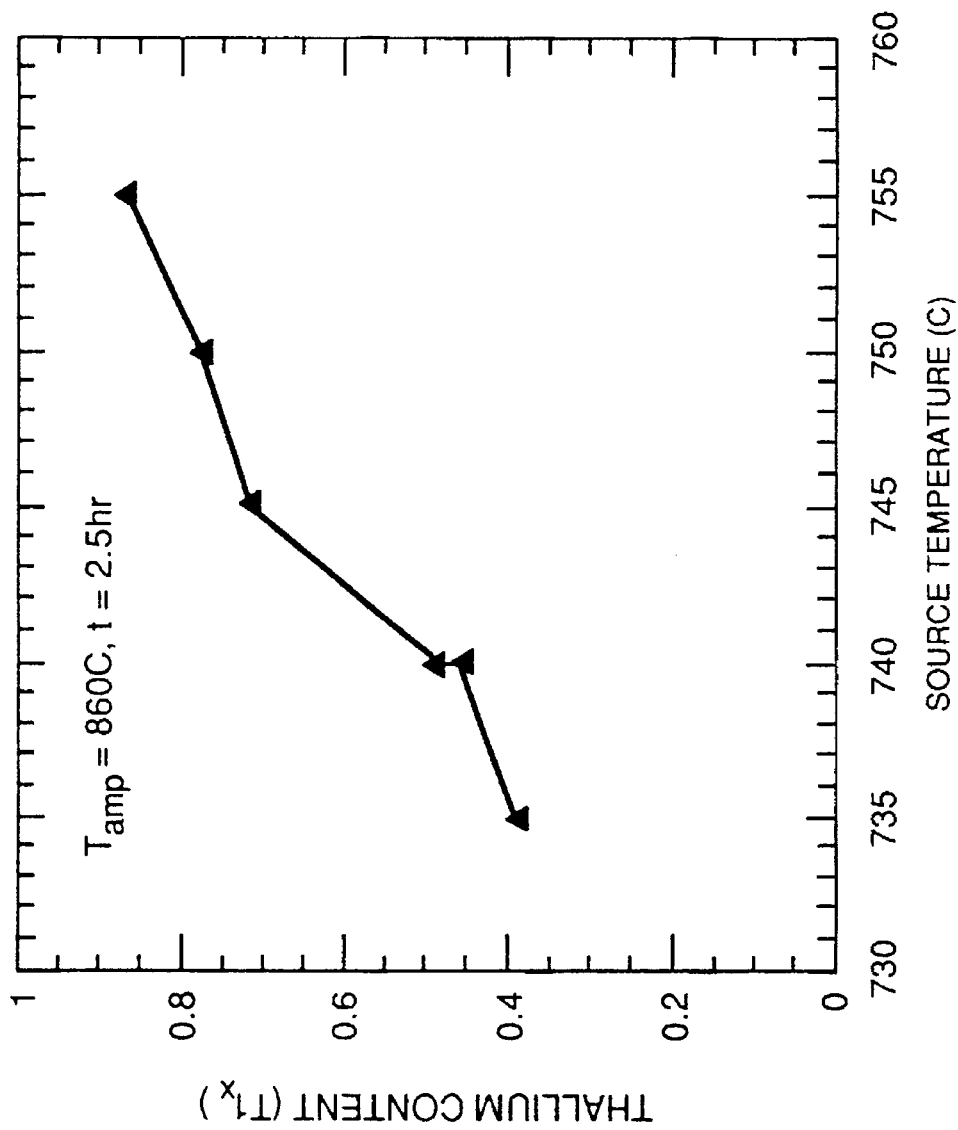
FIG. 2 is a graph of the thallium content incorporated into a precursor deposit versus the thallium source temperature during processing.

The precursor deposit was then heated in a two-zone reactor. An oxygen flow of approximately 20 sccm passed over the thallium source ($Tl_2O_3$) to the precursor deposit. The precursor deposit and the thallium source zones were heated in 40 minutes from 400° to 860° C. and from 400° to 600° C., respectively. The sample is soaked at 860° C. for about 58 minutes while the thallium source temperature is varied as follows. First, the thallium source is ramped from 600° to 690° C. in 24 minutes, then from 690° to 740° in 10 minutes. The thallium source is soaked at 740° C. for 2½ hours whereupon an average thallium content of $Tl_x=0.6$ is incorporated into the film. After the soak, the sample and source are simultaneously furnace cooled. Transport measurements were made after annealing the film at 600° C. for 8 hours. Transport measurements using a current of 0.5 Amp showed a zero resistance transition temperature of about 105K. FIG. 1 shows the critical current density defined at 1 microvolt across a 4 mm length of a 2 mm wide test bridge patterned on the silver substrate. FIG. 2 shows the thallium content incorporated into the precursor deposit versus the thallium source temperature.

What is claimed is:

1. A method of fabricating a polycrystalline (1223) thallium barium-calcium-copper-oxide superconductor which comprises the steps of:

depositing on a metal or ceramic substrate a powder precursor consisting essentially of compounds, except thallium compounds, that form the (1223) thallium-barium-calcium-copper-oxide superconductor in a stoichiometric amount;

increasing the density of the powder precursor on the substrate by compressing said powder precursor at a pressure of at least about 1000 kg/cm² to promote granular orientation; and then soaking the compressed powder precursor on the substrate with thallium at a temperature between 840°–930° C. in the presence of a partial pressure of a thallium-containing vapor for a period of time to form the (1223) thallium-barium-calcium-copper-oxide superconductor with C-axis orientation of the superconducting crystals.

2. A method according to claim 1 where said substrate is flexible or rigid material.

3. A method according to claim 2 where said substrate is selected from the group consisting of silver, gold, palladium, platinum, high temperature alloys, lanthanum aluminate, strontium titanate, magnesium oxide, and yttria stabilized zirconia.

4. A method according to claim 1 where the powder precursor contains the compounds with cations in stoichiometric amounts to form the thallium-barium-calcium-copper-oxide superconductor and a silver-containing species.

5. A method according to claim 1 where the pressure is about 5000 kg/cm².

6. A method according to claim 1 where the thallium vapor is from a thallium source at a temperature between about 700°–780° C.

7. A method for making a (1223) thallium-barium-calcium-copper-oxide superconductor comprising the steps of: depositing a powder precursor, that is thallium-free, on a metal or ceramic substrate, followed by pressing or rolling of at least about 1000 kg/cm₂ to increase the density of the precursor deposit on the substrate through compression to promote granular orientation, and then processing the densified precursor on the substrate at temperatures between about 840°–930° C. in an oxygenated environment with a partial pressure of a thallium vapor species from a thallium source at a temperature of about 700°–780° C. for time sufficient to form the (1223) thallium-barium-calcium-copper-oxide superconductor having C-axis orientation of the superconducting crystals.

8. A method according to claim 7 where said substrate is flexible or rigid material.

9. A method according to claim 7 where said substrate is selected from the group consisting of silver, gold, palladium, platinum, high temperature alloys, lanthanum aluminate, strontium titanate, magnesium oxide, and yttria stabilized zirconia.

10. A method according to claim 7 where the powder precursor contains the compounds with cations of barium, calcium, and copper in stoichiometric amounts to form the thallium-barium-calcium-copper-oxide superconductor.

11. A method according to claim 7 where the powder precursor contains the compounds with cations of strontium, calcium, and copper in stoichiometic amounts to form the thallium-barium-calcium-copper-oxide superconductor.

12. A method according to claim 7 where the powder precursor contains the compounds with cations of lead, strontium, barium, calcium, and copper in stoichiometic amounts to form the thallium-barium-calcium-copper-oxide superconductor.

13. A method according to claim 7 where the powder precursor contains compounds with cations in stoichiometric amounts to form the thallium-barium-calcium-copper-oxide superconductor and the precursor contains a silver-containing species.

14. A method according to claim 7 where the pressure is about 5000 kg/cm².

* * * * *